(12) United States Patent
Ding et al.

(10) Patent No.: US 11,101,254 B2
(45) Date of Patent: Aug. 24, 2021

(54) FLIP-CHIP LIKE INTEGRATED PASSIVE PREPACKAGE FOR SIP DEVICE

(71) Applicant: Intel Corporation, Santa Clara, CA (US)

(72) Inventors: Zhicheng Ding, Shanghai (CN); Bin Liu, Shanghai (CN)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/777,810

(22) PCT Filed: Dec. 25, 2015

(86) PCT No.: PCT/CN2015/098867
§ 371 (c)(1),
(2) Date: May 21, 2018

(87) PCT Pub. No.: WO2017/107174
PCT Pub. Date: Jun. 29, 2017

(65) Prior Publication Data
US 2018/0374835 A1    Dec. 27, 2018

(51) Int. Cl.
H01L 25/16 (2006.01)
H01L 21/66 (2006.01)
(Continued)

(52) U.S. Cl.
CPC .............. *H01L 25/16* (2013.01); *H01L 22/14* (2013.01); *H01L 24/32* (2013.01); *H01L 24/48* (2013.01);
(Continued)

(58) Field of Classification Search
CPC ... H01L 25/0657; H01L 25/065; H01L 23/02; H01L 23/28; H01L 23/3128; H01L 23/5385; H01L 23/538–5389
See application file for complete search history.

(56) References Cited

U.S. PATENT DOCUMENTS 6,376,904 B1    4/2002  Haba et al.
7,242,081 B1 *  7/2007  Lee ..................... H01L 25/0657
                                                  257/686
(Continued)

FOREIGN PATENT DOCUMENTS

CN    1617315 A    5/2005
CN    101017811 A  8/2007
(Continued)

OTHER PUBLICATIONS

International Preliminary Report on Patentablity for International Patent Application No. PCT/CN2015/098867, dated Jul. 5, 2018, 12 pages.
(Continued)

*Primary Examiner* — Laura M Menz
*Assistant Examiner* — Candice Chan
(74) *Attorney, Agent, or Firm* — Schwabe, Williamson & Wyatt, P.C.

(57) ABSTRACT

A system in package and method for making a system in package. A plurality of passive devices are coupled to an interposer. A molding compound envelopes the plurality of passive devices and defines a platform having a substantially planar surface. The interposer is coupled to a substrate. A plurality of integrated circuit dies are coupled in a stack to the planar surface.

12 Claims, 4 Drawing Sheets

(51) Int. Cl.
  *H01L 23/00*  (2006.01)
  *H01L 25/18*  (2006.01)
  *H01L 25/00*  (2006.01)
  *H01L 25/065* (2006.01)

(52) U.S. Cl.
  CPC ............ *H01L 24/73* (2013.01); *H01L 24/92* (2013.01); *H01L 25/18* (2013.01); *H01L 25/50* (2013.01); *H01L 25/0657* (2013.01); *H01L 2224/32145* (2013.01); *H01L 2224/32225* (2013.01); *H01L 2224/4809* (2013.01); *H01L 2224/48091* (2013.01); *H01L 2224/48147* (2013.01); *H01L 2224/48227* (2013.01); *H01L 2224/73265* (2013.01); *H01L 2224/92247* (2013.01); *H01L 2225/0651* (2013.01); *H01L 2225/06562* (2013.01); *H01L 2924/00014* (2013.01); *H01L 2924/1433* (2013.01); *H01L 2924/1434* (2013.01); *H01L 2924/15311* (2013.01); *H01L 2924/19103* (2013.01); *H01L 2924/19105* (2013.01)

(56) References Cited

U.S. PATENT DOCUMENTS

| | | | | |
|---|---|---|---|---|
| 2008/0093723 | A1* | 4/2008 | Myers | H01L 25/0657 257/686 |
| 2010/0047965 | A1 | 2/2010 | Chiang | |
| 2011/0084380 | A1* | 4/2011 | Kwon | H01L 23/13 257/724 |
| 2012/0187545 | A1* | 7/2012 | Khan | H01L 21/561 257/621 |
| 2014/0203395 | A1 | 7/2014 | Tsai et al. | |

FOREIGN PATENT DOCUMENTS

| | | | |
|---|---|---|---|
| JP | 2011198842 A | 10/2011 | |
| KR | 10-2012-0072393 | 7/2012 | |
| WO | WO-2017101037 A1 * | 6/2017 | ............ H01L 23/28 |

OTHER PUBLICATIONS

International Search Report and Written Opinion for International Patent Application No. PCT/CN2015/098867 dated Jun. 1, 2016, 11 pgs.

Office Action from Taiwan Patent Application No. 105138636, dated Apr. 30, 2020, 11 pgs.

Notice of Allowance from Taiwan Patent Application No. 105138636, dated Oct. 29, 2020, 3 pgs.

\* cited by examiner

FLIP-CHIP LIKE INTEGRATED PASSIVE PREPACKAGE FOR SIP DEVICE

CROSS-REFERENCE TO RELATED APPLICATION

This patent application is a U.S. National Phase Application under 35 U.S.C. § 371 of International Application No. PCT/CN2015/098867, filed Dec. 25, 2015, entitled "FLIP-CHIP LIKE INTEGRATED PASSIVE PREPACKAGE FOR SIP DEVICE," which designates the United States of America, the entire disclosure of which is hereby incorporated by reference in its entirety and for all purposes.

FIELD

Embodiments of the invention relate to systems in package (SIPs). More specifically, embodiments of the invention relate to reduced area SIPs.

BACKGROUND

Systems in package (SIPs) are becoming increasingly popular as a result of improved performance in small form factors. SIPs integrate active integrated circuit (IC) dies and discrete components, also referred to as passives or passive devices, in a single package. The assembly process for SIPs is quite complex, and that complexity is exacerbated where large numbers of passive devices are needed. In some cases, there may be as many as 200 passive devices in a single SIP. Passive devices, also referred to herein as "passives", include capacitors, inductors, resistors, voltage regulators, transformers and the like.

Historically, the active ICs are coupled onto the surface of the printed circuit board and wire bonded thereto. The passives are distributed around the ICs on the circuit board. As a result, the requirement of large numbers of passives significantly increases the SIP dimension in x and y. Increasingly, the SIPs are used in smaller and thinner form factors such as smart phones, tablets and other mobile devices. As a result, size, both in x and y and also in z, becomes a critical factor.

In an effort to reduce the size, some have tried to embed a percentage of the passives in the printed circuit board (PCB) so that fewer are on the surface, thereby reducing the x and y dimension. However, this possible solution significantly increases the cost and complexity of manufacturing the substrate, increasing costs and reducing yields.

Another proposed solution is to use an interposer to mount passive devices and application-specific integrated circuits (ASICs). The routing requirement for ASIC and passives combined typically requires a six or greater level interposer, which significantly increases z-dimension. The interposer may then be attached on top of a stack of other active ICs and wire bonded to the substrate. The wire bonding and length of the signal path can negatively affect signal quality. Additionally, the cost of the interposer, coupled with the significant increase in z dimension, renders this solution unsuitable for many applications.

Another proposal has been to place the IC dies directly above the passives. To accomplish this, the passives that support the die need to be substantially co-planar. It is quite difficult to ensure a level height of the plurality of passives. There is a significant concern posed by possible tilt during the wire bond process. Additionally, the initial die and the die-attach film attaching the surface of the die to the passives must be thick enough to avoid cracking of that die or other dies in the stack. Generally, high volume manufacturing using this technique has not been found feasible.

BRIEF DESCRIPTION OF THE DRAWINGS

Embodiments of the invention are illustrated by way of example and not by way of limitation in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
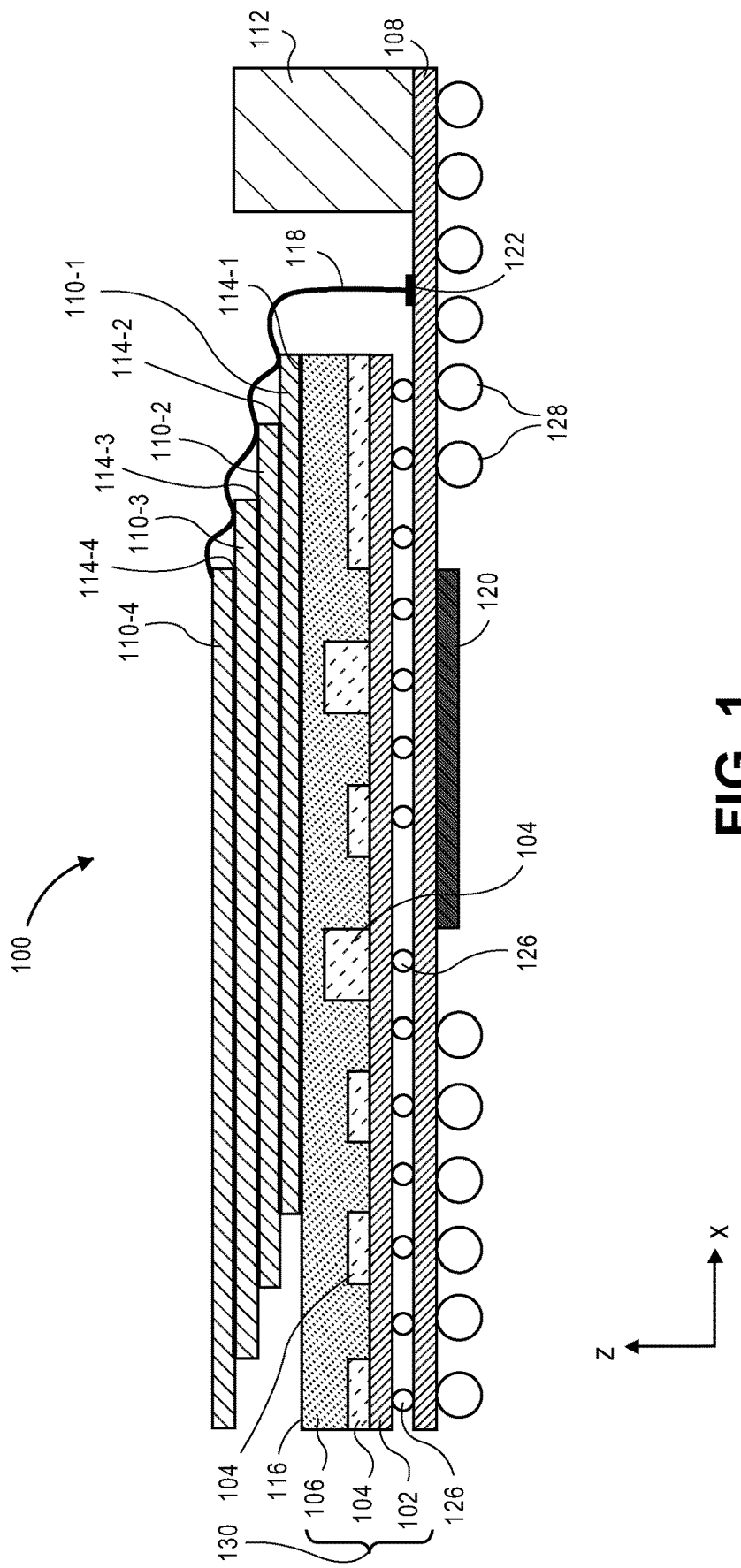
FIG. 1 is a sectional side view of a system in a package (SIP) according to one embodiment of the invention.

FIG. 1 is a sectional side view of a system in package (SIP) according to one embodiment of the invention. In this view, the x and z dimensions of the SIP 100 are shown. As used herein, the x y dimensions refer to length and width (the long dimensions of the device) and z refers to the height or thickness (the shortest dimension) of the device.

An interposer 102 is used to mount a plurality of passive devices 104 directly thereon. The passive devices 104 are selected from the passive devices required in the SIP 100 having a z dimension below a threshold. The threshold is determined based on the maximum desired z dimension of the overall SIP. Interposer 102 may be quite simple because the routing requirements for passives tend to be relatively simple. Therefore, to control the z dimension, an interposer 102 of four layers or fewer is typically used. In one embodiment, interposer 102 has only two layers.

Interposer 102 may be a land grid array interposer; that is, the conductive connection points 126 are formed as a land grid array. In other embodiments, a ball grid array or any other suitable technology for providing electric connectivity to the interposer may be used. It is desirable to select the x and y dimensions of interposer 102 carefully to minimize overall system size. Appropriate selection of interposer dimensions is discussed in more detail below with reference to FIG. 2.

After the passive devices 104 are coupled to the interposer, molding material 106 is introduced to envelope the passive devices 104 and form a substantially planar upper surface that can be used for mounting integrated circuit (IC) dies, as discussed below. The interposer 102, passive devices 104 and molding material 106 collectively form a prepackage that is independently testable prior to installation as part of the SIP 100. Thus, after formation, the individual units may be tested to ensure the passives are functioning properly for continued with inclusion in the SIP 100. Molding material 106 is typically an epoxy resin, and the molding can be performed using substantially any conventional low pressure molding, including, without limitation, channel flow molding, pin gate molding and the like. To the extent that there are any substantial non-planarities of the upper surface after molding, the surface of molding material 106 can be planarized using various grinding techniques. However, many molding techniques will yield a perfectly satisfactory substantially planar surface without additional post-processing.

SIP 100 has a primary substrate 108 to which the prepackage 130 is attached. Interposer 102 may be reflowed to couple prepackage 130 to substrate 108. Substrate 108 has a plurality of contacts 128 that may be arranged as a ball grid array, pin grid array or other arrange suitable to provide conductive communication in the system containing the SIP 100.

A layer of die-attach film 114-1 is placed between platform surface 116 and a first IC die 110-1, thereby attaching the IC die 110-1 to platform surface 116. In one embodiment, the IC die 110-1 is attached to the prepackage 116 to be substantially flush with an edge of the prepackage 116. Successive layers of die-attach film 114-2, 114-3 and 114-4 couple successive IC dies 110-2, 110-3, 110-4 (generically 110) into a stair-stepped stack. That is, each successive die 110-2, 110-3 and 110-4 is staggered from the one below it so that all dies 110 can be wire bonded to the substrate 108 in a single bonding area 122. In one embodiment, the number of dies 114 in a stack coupled with the offset causes the stack collectively to have an x dimension equal to the x dimension of the prepackage. While four ICs 110 are shown, more or fewer ICs may be used in other embodiments of the invention. In some embodiment of the invention, the ICs in the stack are memory ICs. Memory dies tend to be the largest dies in use in SIP manufacture.

In some embodiments, additional passive devices 112, particularly those having z dimensions greater than the threshold, are coupled directly to substrate 108. In some embodiments, application-specific integrated circuit (ASIC) 120 may be coupled directly to an opposing side of substrate 108. This direct coupling shortens the signal path and thereby improves the signal quality. ASICs tend to be smaller than the memory dies. Accordingly, the ASICs tend not to be the limiting factor on SIP x-y dimensions. By using the opposing side of the substrate for direct connection of the ASIC 120, a reduction of ultimate z-dimension is achieved.

Figure 2:
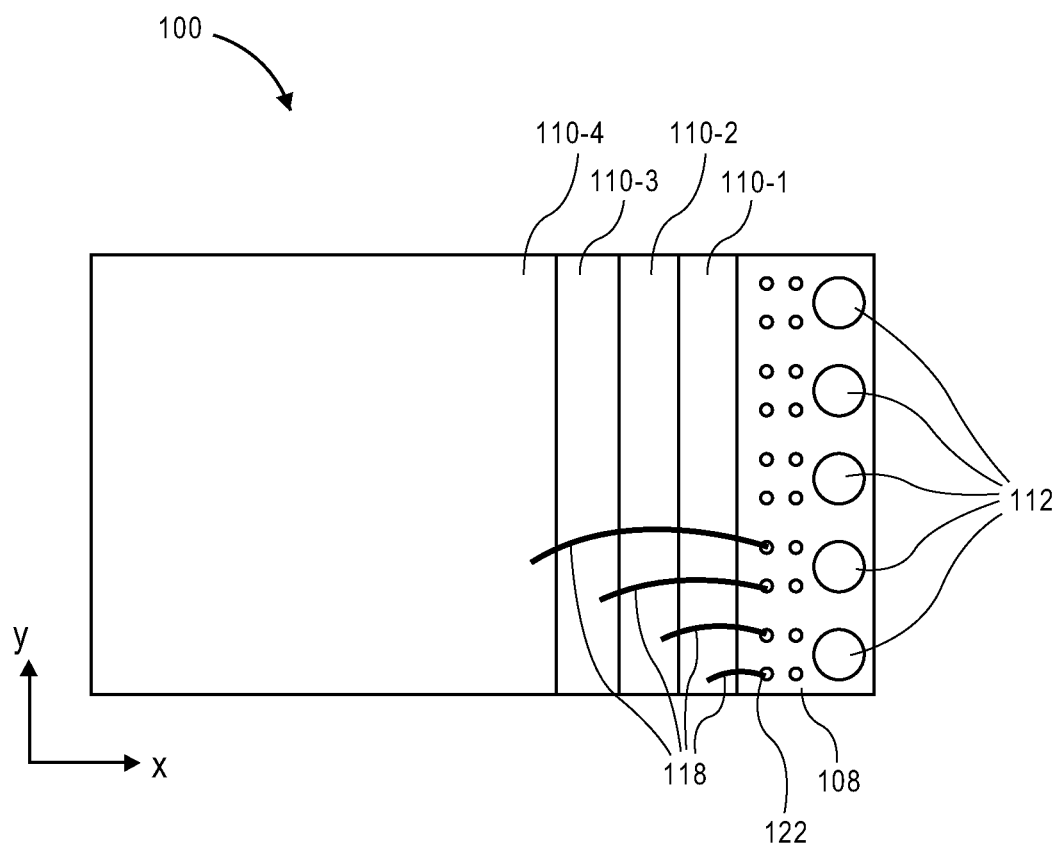
FIG. 2 is a schematic top view of the SIP of FIG. 1.

FIG. 2 is a schematic top view of the SIP of FIG. 1. In this view, the x and y dimensions of the SIP are visible. Substrate 108 has the plurality of additional passive devices 112 coupled directly thereto. However, in this view, it can be seen that the die 110 stack has dimensions in x and y that are substantially equal to those of the prepackage 130. Thus, in this manner, the x and y dimensions of the system as a whole are substantially reduced.

Figure 3:
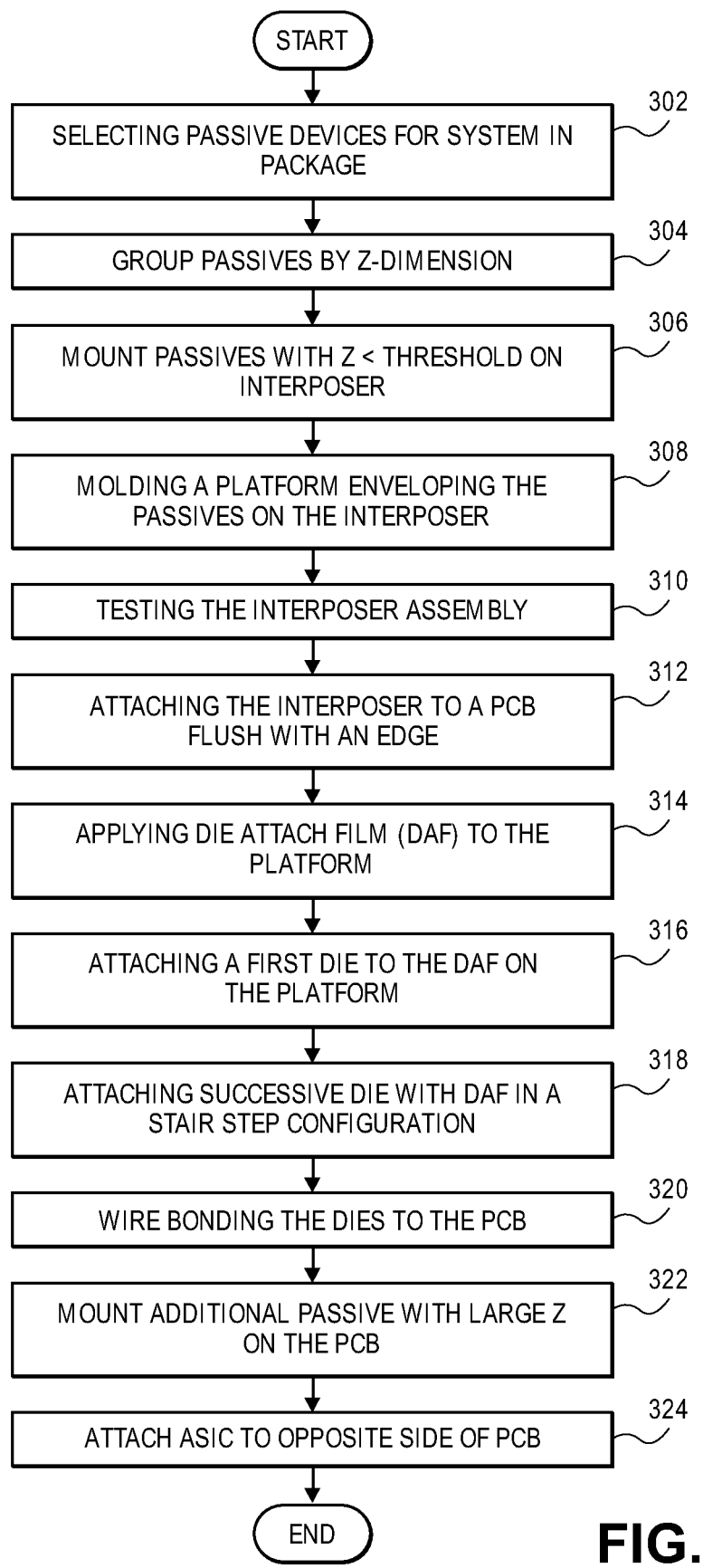
FIG. 3 is a flow diagram for producing a system in a package according to one embodiment of the invention.

FIG. 3 is a flow diagram for producing a system in a package according to one embodiment of the invention. At block 302, the passive devices required for the system in a package are selected. The passives are grouped by z dimension at block 304. Passives with a z less than a threshold are mounted onto an interposer at block 306. At block 308, a platform is molded over the interposer enveloping the passive devices on the interposer. The platform may be molded using, e.g., pin-gate molding, channel flow molding, or other type of low pressure molding techniques. Suitable epoxy resins are widely commercially available. The interposer assembly (also referred to as a prepackage) may be tested independently at block 310. This testing can ensure that all contacts are present and all the passive devices are functioning as expected.

Assuming that the interposer passes the test at block 310, the interposer is attached to a substrate such as a printed circuit board (PCB) flush with at least one edge of the PCB. The PCB-interposer relationship may be selected such that the y dimension of the substrate and the interposer are substantially equal while the x dimension of the interposer is somewhat less than the x dimension of the PCB. The reduced x dimension leaves unoccupied space on the substrate for wired bonding of the ICs and coupling of additional required devices. The attachment of the interposer may be performed by reflowing the interposer once it is correctly positioned on the PCB.

Once the PCB and interposer are coupled together. Then, at block 314, additional passive devices with a large z are mounted on the PCB. And then die-attach film is applied to the platform at block 316. The first circuit die may then be attached to the die-attach film on the platform at block 318. Preferably, the first die is attached substantially flush with an edge of a platform adjacent to a portion of the substrate that remains exposed after attachment of the interposer. At block 320, additional circuit die are attached using die-attach film such that they have a stair-step configuration. The dies are then wire bonded to the PCB at block 322. After wire bonding, at block 324, molding material is introduced to envelop all components, dies and wires at top side of the substrate. This molding can be performed using any conventional low pressure molding with epoxy resin. At block 326, an ASIC may be attached to the opposite side of the PCB, providing a short, high-quality signal path for the ASIC to the other system components. In this way, a SIP efficiently using x, y, and z dimensions is created.

Figure 4:
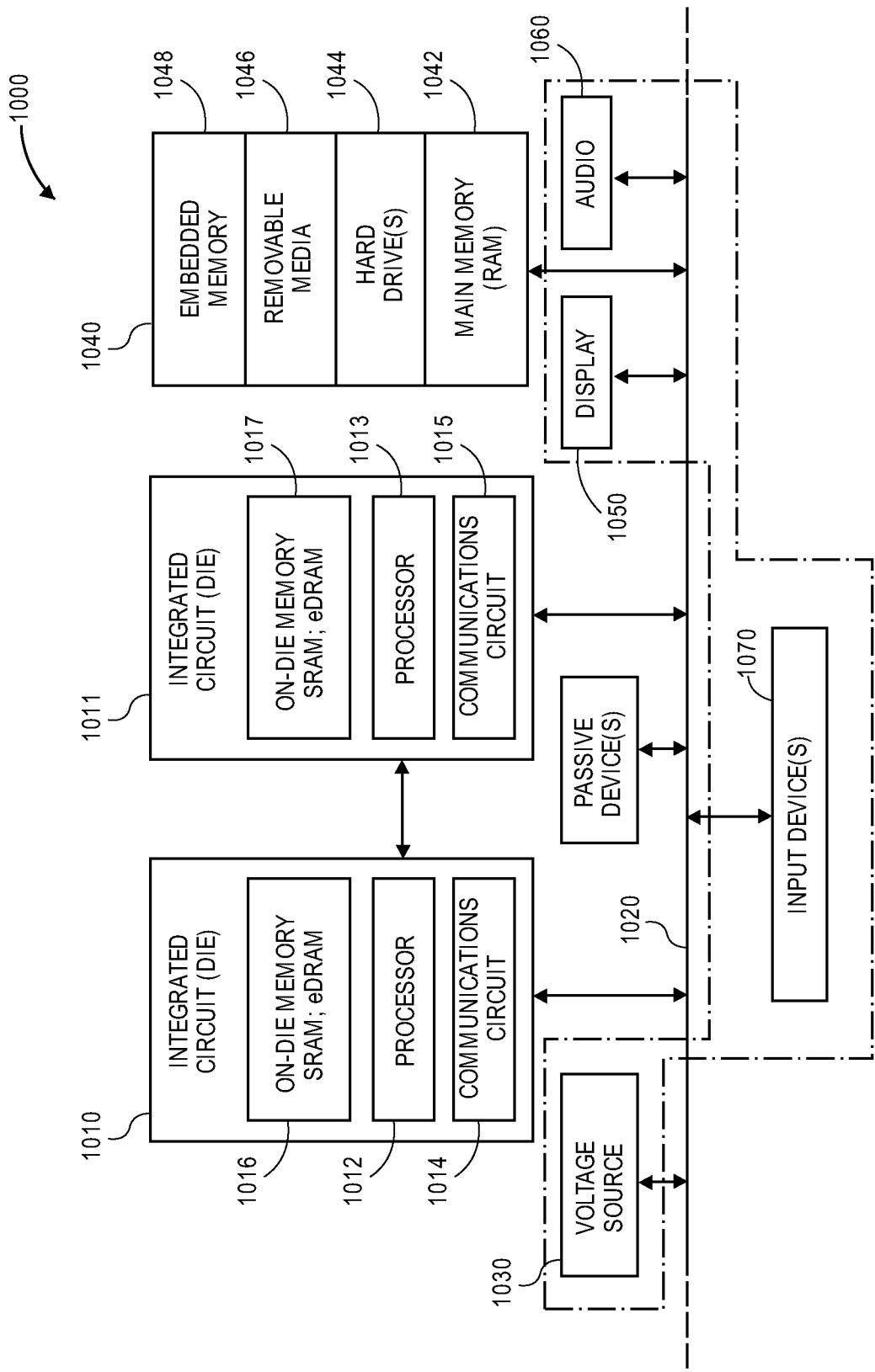
FIG. 4 is a block diagram of a system according to one embodiment of the invention.

FIG. 4 is a block diagram of a system according to one embodiment of the present invention. The computer system 1000 (also referred to as the electronic system 1000) as depicted can embody a SIP, according to any of the several disclosed embodiments and their equivalents as set forth in this disclosure. The computer system 1000 may be a mobile device such as a netbook computer. The computer system 1000 may be a mobile device such as a wireless smart phone. The computer system 1000 may be a desktop computer. The computer system 1000 may be a hand-held reader. The computer system 1000 may be a server system. The computer system 1000 may be a supercomputer or high-performance computing system.

In an embodiment, the electronic system 1000 is a computer system that includes a system bus 1020 to electrically couple the various components of the electronic system 1000. The system bus 1020 is a single bus or any combination of busses according to various embodiments. The electronic system 1000 includes a voltage source 1030 that provides power to the integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. In an embodiment, the processor 1012 includes, or is coupled with, a SIP as disclosed herein. In an embodiment, SRAM embodiments are found in memory caches of the processor. Other types of circuits that can be included in the integrated circuit 1010 are a custom circuit or an application-specific integrated circuit (ASIC), such as a communications circuit 1014 for use in wireless devices such as cellular telephones, smart phones, pagers, portable computers, two-way radios, and similar electronic systems, or a communications circuit for servers. In an embodiment, the integrated circuit 1010 includes on-die memory 1016 such as static random-access memory (SRAM). In an embodiment, the integrated circuit 1010 includes embedded on-die memory 1016 such as embedded dynamic random-access memory (eDRAM).

In an embodiment, the integrated circuit 1010 is complemented with a subsequent integrated circuit 1011. Useful embodiments include a dual processor 1013 and a dual communications circuit 1015 and dual on-die memory 1017 such as SRAM. In an embodiment, the dual integrated circuit 1010 includes embedded on-die memory 1017 such as eDRAM.

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. The external memory 1040 may also be embedded memory 1048 such as the first die in a die stack, according to an embodiment.

In an embodiment, the electronic system 1000 also includes a display device 1050, an audio output 1060. In an embodiment, the electronic system 1000 includes an input device such as a controller 1070 that may be a keyboard, mouse, trackball, game controller, microphone, voice-recognition device, or any other input device that inputs information into the electronic system 1000. In an embodiment, an input device 1070 is a camera. In an embodiment, an input device 1070 is a digital sound recorder. In an embodiment, an input device 1070 is a camera and a digital sound recorder. In an embodiment, an input device is a touch screen that may be part of display device 1050.

As shown herein, the integrated circuit 1010 can be implemented in a number of different embodiments, including a SIP, according to any of the several disclosed embodiments and their equivalents, an electronic system, a computer system, one or more methods of fabricating an integrated circuit, and one or more methods of fabricating an electronic assembly that includes a SIP, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed SIP embodiments and their equivalents. A foundation substrate may be included, as represented by the dashed line of FIG. 4. Passive devices may also be included, as is also depicted in FIG. 4.

The following examples pertain to further embodiments. The various features of the different embodiments may be variously combined with some features included and others excluded to suit a variety of different applications. Some embodiments relate to a system in package having an interposer with a plurality of passive devices coupled to the interposer. A molding compound envelopes the plurality of passive devices and defines a platform having a substantially planar surface. The interposer is coupled to a substrate. A plurality of integrated circuit dies are coupled in a stack to the planar surface.

In a further embodiment, an application-specific integrated circuit (ASIC) is coupled to an opposing surface of the substrate from the interposer.

In a further embodiment, a plurality of layers of die attach film (DAF) are applied to couple the circuit dies to the platform and to each other. In one embodiment, one layer of DAF resides between the planar surface and a first of the plurality of integrated circuit dies, and one layer resides between each pair of dies in the stack.

In a further embodiment, the stack of dies has a stair-step profile and the substrate has a wire bonding area adjacent to a bottom step.

In a further embodiment, a second group of passive devices are coupled directly to the substrate. At least some of the passive devices coupled directly to the substrate have z dimension greater than a maximum z dimension of the platform.

In a further embodiment, the interposer, first plurality of passive devices, and platform form a pre-package that can be independently tested before attachment to the substrate.

In a further embodiment, the interposer has fewer than four layers.

In a further embodiment, the platform has dimensions in x and y substantially equal to the dimensions of the stack in x and y.

In a further embodiment, wherein the interposer has a land grid array.

Some embodiments relate to a method of creating a system in package by mounting a plurality of passive devices onto an interposer and molding a platform of mold material on the interposer to enveloping the passive devices. The interposer is then coupled to a substrate. A die stack is attached to the platform on the interposer.

In a further embodiment, an application-specific integrated circuit (ASIC) is coupled to an opposing side of the substrate from the interposer.

In a further embodiment, a second plurality of passive devices are mounted directly on the substrate.

In a further embodiment, the set of passive devices used in the system in package are grouped into a first plurality and a second plurality based on a z dimension of the devices.

In a further embodiment, a layer of die attach film (DAF) is applied to a surface of the platform. A first integrated circuit die is placed substantially flush with the edge of the platform nearest a set of bonding pads on the substrate. A second layer of DAF is applied to a surface of the first integrated circuit die. A second integrated circuit die is placed offset from the edge of the platform.

In a further embodiment, the first and second integrated circuit dies are wire bonded to the bonding pads.

In a further embodiment, the interposer is coupled to the substrate by aligning the interposer with an edge of the substrate and then reflowing connection points of the interposer.

In a further embodiment, the passive devices and interposer are tested after molding and before coupling to the substrate.

Some embodiments relate to a system with interactive display having a system in package as part of the larger system. Some such embodiment include a system in package having an interposer with a plurality of passive devices coupled to the interposer. A molding compound envelopes the plurality of passive devices and defines a platform having a substantially planar surface. The interposer is coupled to a substrate. A plurality of integrated circuit dies are coupled in a stack to the planar surface. The system in package is coupled to and drives a display. The display has a touch screen interface coupled thereto.

In a further embodiment, the system in a package has an application-specific integrated circuit (ASIC) coupled to an opposing side of the substrate relative to the interposer.

In a further embodiment, the platform has its dimensions in x and y substantially equal to the dimensions in x and y of the integrated die stack.

Some embodiments relate to a system in package having a substrate. The system in package also includes a means for encapsulating passive devices as a pre-testable unit while defining a planar platform that is distinct from the substrate. A plurality of integrated circuit dies are coupled to the platform.

In a further embodiment, the pre-testable unit includes an interposer with a plurality of passive devices coupled to it. A molding material is molded over the interposer enveloping the passive devices.

In a further embodiment, the pre-testable unit is coupled to a first side of the substrate and an application-specific integrated circuit (ASIC) is coupled a second side of the substrate.

While embodiments of the invention are discussed above in the context of flow diagrams reflecting a particular linear order, this is for convenience only. In some cases, various operations may be performed in a different order than shown or various operations may occur in parallel. It should also be recognized that some operations described with respect to one embodiment may be advantageously incorporated into another embodiment. Such incorporation is expressly contemplated.

In the foregoing specification, the invention has been described with reference to the specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense.

What is claimed is:

1. A system in package comprising:
   an interposer having a lateral width;
   a plurality of passive devices each having a first side and a second side opposite the first side, the first side coupled to the interposer;
   a molding compound enveloping the plurality of passive devices and completely covering the second side of each of the plurality of passive devices, the molding compound defining a platform having a substantially planar surface, and the molding compound having a lateral width the same as the lateral width of the interposer;
   a substrate to which the interposer is coupled;
   an additional passive device coupled directly to the substrate, the additional passive device having a top surface above the substantially planar surface of the molding compound; and
   a plurality of integrated circuit dies coupled in a stack to the planar surface, wherein the molding compound electrically isolates the plurality of integrated circuit dies from the plurality of passive devices.

2. The system in package of claim 1, further comprising:
   an application-specific integrated circuit (ASIC) coupled to an opposing surface of the substrate from the interposer.

3. The system in package of claim 1, further comprising:
   a plurality of layers of die attach film (DAF), one layer between the planar surface and a first of the plurality of integrated circuit dies, and one layer between each pair of dies in the stack.

4. The system in package of claim 1, wherein the stack has a stair-step profile, and wherein the substrate has a wire bonding area adjacent to a bottom step.

5. The system in package of claim 1, further comprising:
   a second plurality of passive devices coupled directly to the substrate, at least some of the passive devices in the second plurality having a z dimension greater than a maximum z dimension of the platform.

6. The system in package of claim 1, wherein the interposer, first plurality of passive devices, and platform form a free package that is independently testable from the substrate.

7. The system in package of claim 1, wherein the interposer has fewer than four layers.

8. The system in package of claim 1, wherein the platform has dimensions in x and y substantially equal to the dimensions of the stack in x and y.

9. The system in package of claim 1, wherein the interposer comprises: a land grid array.

10. A system comprising:
    a system in package including:
      an interposer having a lateral width;
      a plurality of passive devices each having a first side and a second side opposite the first side, the first side coupled to the interposer;
      a molding compound enveloping the plurality of passive devices and completely covering the second side of each of the plurality of passive devices, the molding compound defining a platform having a substantially planar surface, and the molding compound having a lateral width the same as the lateral width of the interposer;
      a substrate to which the interposer is coupled;
      an additional passive device coupled directly to the substrate, the additional passive device having a top surface above the substantially planar surface of the molding compound; and
      a plurality of integrated circuit dies coupled in a stack to the planar surface, wherein the molding compound electrically isolates the plurality of integrated circuit dies from the plurality of passive devices;
    a display driven by the system in package; and
    a touchscreen interface coupled to the display.

11. The system of claim 10, further comprising an application-specific integrated circuit (ASIC) coupled to an opposing side of the substrate relative to the interposer.

12. The system of claim 11 wherein the platform has its dimensions in x and y substantially equal to the dimensions in x and y of the integrated die stack.

* * * * *